(12) United States Patent
Xie et al.

(10) Patent No.: US 10,593,898 B2
(45) Date of Patent: Mar. 17, 2020

(54) BASE CARRIER, FLEXIBLE DISPLAY PANEL AND MANUFACTURING METHOD THEREOF, FLEXIBLE DISPLAY DEVICE

(71) Applicant: BOE TECHNOLOGY GROUP CO., LTD., Beijing (CN)

(72) Inventors: Chunyan Xie, Beijing (CN); Ming Che Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/528,817

(22) PCT Filed: Mar. 1, 2016

(86) PCT No.: PCT/CN2016/075200
§ 371 (c)(1),
(2) Date: May 23, 2017

(87) PCT Pub. No.: WO2016/169336
PCT Pub. Date: Oct. 27, 2016

(65) Prior Publication Data
US 2017/0317301 A1 Nov. 2, 2017

(30) Foreign Application Priority Data
Apr. 20, 2015 (CN) .......................... 2015 1 0189087

(51) Int. Cl.
*H01L 51/00* (2006.01)
*H01L 21/77* (2017.01)
(Continued)

(52) U.S. Cl.
CPC .......... *H01L 51/0097* (2013.01); *H01L 21/77* (2013.01); *H01L 27/12* (2013.01);
(Continued)

(58) Field of Classification Search
CPC .................................................... H01L 27/3244
See application file for complete search history.

(56) References Cited

U.S. PATENT DOCUMENTS 9,651,996 B2 * 5/2017 Zhou ...................... G06F 1/1652
2004/0000870 A1 * 1/2004 Kifune .................... H01J 11/12
313/582
(Continued)

FOREIGN PATENT DOCUMENTS

CN 101980393 A 2/2011
CN 102185023 A 9/2011
(Continued)

OTHER PUBLICATIONS

Chinese Search Report dated Sep. 1, 2015.
(Continued)

*Primary Examiner* — Eugene Lee
(74) *Attorney, Agent, or Firm* — Dilworth & Barrese, LLP; Michael J. Musella, Esq.

(57) ABSTRACT

A base carrier configured to carry a flexible base of a flexible display panel is provided. The flexible display panel includes a display region and a circuit bonding region. A surface of an area of the base carrier corresponding to the display region is smooth, and a surface of an area of the base carrier corresponding to the circuit bonding region is formed with a plurality of micro-grooves. The structure of the base carrier is such that when the flexible base is separated from the base carrier, the amount of laser required for peeling in each of the display region and the circuit bonding region are the same and such that the base carrier can be separated from the flexible display panel by performing the laser scanning once, which simplifies the processes.

20 Claims, 2 Drawing Sheets

(51) Int. Cl.
*H01L 27/12* (2006.01)
*H01L 27/32* (2006.01)
*H01L 51/56* (2006.01)

(52) U.S. Cl.
CPC .......... *H01L 27/3244* (2013.01); *H01L 51/56* (2013.01); *H01L 27/32* (2013.01); *H01L 2227/323* (2013.01); *H01L 2251/5338* (2013.01); *Y02E 10/549* (2013.01)

(56) References Cited

U.S. PATENT DOCUMENTS

| | | | |
|---|---|---|---|
| 2005/0078459 A1* | 4/2005 | Yeon | G02F 1/13452 361/749 |
| 2007/0222935 A1 | 9/2007 | Belyaev | |
| 2012/0119367 A1* | 5/2012 | Haba | H01L 23/49838 257/773 |
| 2013/0155357 A1* | 6/2013 | Ota | G02F 1/133512 349/110 |
| 2013/0249740 A1* | 9/2013 | Shedletsky | H01Q 1/38 343/700 MS |
| 2015/0022772 A1* | 1/2015 | Akiyoshi | G02F 1/1339 349/153 |

FOREIGN PATENT DOCUMENTS

| | | | | |
|---|---|---|---|---|
| CN | 103247233 A | * | 8/2013 | ........... G06F 1/1652 |
| CN | 203276737 U | * | 11/2013 | |
| CN | 103681357 A | | 3/2014 | |
| CN | 103682176 A | | 3/2014 | |
| CN | 104392901 A | | 3/2015 | |
| CN | 104752443 A | | 7/2015 | |

OTHER PUBLICATIONS

International Search Report dated Jun. 13, 2016.
First Chinese Office Action dated Nov. 4, 2015.
Second Chinese Office Action dated Dec. 29, 2015.

* cited by examiner

BASE CARRIER, FLEXIBLE DISPLAY PANEL AND MANUFACTURING METHOD THEREOF, FLEXIBLE DISPLAY DEVICE

TECHNICAL FIELD

Embodiments of the present disclosure relate to a base carrier, a flexible display panel and a manufacturing method thereof, and a flexible display device.

BACKGROUND

Flexible display technology can be used to form wearable display products and has been paid more and more attentions by those skilled in the display field.

As illustrated in FIG. 1, a flexible display panel 200 is manufactured typically by forming a flexible base 201 on a base carrier 100, then preparing a TFT and a display device and the like on an area corresponding to a display region 11 of the flexible base 201, and then bonding a circuit board and the like on an area corresponding to a circuit bonding region 12 of the flexible base 201, and then separating the flexible base 201 from the base carrier. And thus the flexible display panel 200 is formed.

The flexible base is separated from the glass base carrier typically by laser scanning. The flexible display panel is subjected to treatments such as hot pressing during the bonding circuit board and the material of the circuit board is relatively hard, so that peeling off the flexible base in the circuit bonding region of the flexible display panel from the glass base carrier requires more amount of laser than peeling off the flexible base in the display region. In conventional arts, scanning is performed separately for the circuit bonding region and the display region of the flexible display panel. On the one hand, not only the process is complex, but also more dust will be produced by performing laser scanning twice. On the other hand, when performing the laser scanning twice, overlapping scanning area in the flexible display panel might be damaged and thus the yield of the product is reduced.

SUMMARY

At least one embodiment of the present disclosure provides a base carrier configured to carry a flexible base of a flexible display panel, the flexible display panel comprising a display region and a circuit bonding region, wherein a surface of an area of the base carrier corresponding to the display region is smooth, and a surface of an area of the base carrier corresponding to the circuit bonding region is formed with a plurality of micro-grooves.

At least one embodiment of the present disclosure provides a manufacturing method of a base carrier configured to carry a flexible base of a flexible display panel, the flexible display panel comprising a display region and a circuit bonding region, wherein the manufacturing method comprises:

forming a plurality of micro-grooves in the surface of an area of the base carrier corresponding to the circuit bonding region, by laser ablation or wet etching.

At least one embodiment of the present disclosure provides a manufacturing method of a flexible display panel, comprising:

forming a flexible base on the base carrier according to the embodiments of the present disclosure;

forming a display device on the surface of the area of the flexible base corresponding to the display region of the flexible display panel;

bonding a circuit on a region of the flexible base corresponding to the surface of the base carrier where the plurality of micro-grooves are formed; and irradiating the display region and the circuit bonding region once by laser from a side of the base carrier opposite to the side where the flexible base is formed, so as to separate the flexible base from the base carrier.

At least one embodiment of the present disclosure provides a flexible display panel which is manufactured by the manufacturing method of a flexible display panel as mentioned above.

At least one embodiment of the present disclosure provides a flexible display device, which comprises the flexible display panel as mentioned above.

Embodiments of the present disclosure provide a base carrier, a flexible display panel and a method manufacturing method thereof. An area of the base carrier corresponding to the circuit bonding region is formed with a plurality of micro-grooves. Gas in the plurality of micro-grooves will be expanded when peeling off the flexible base from the base carrier, so that the amount of laser required to peel off the flexible base in the area corresponding to the circuit bonding region is similar to the amount of laser required to peel off the flexible base in the area corresponding to the display region. Thus, the entire flexible base can be peeled from the base carrier through scanning by laser once.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE NUMERALS

11—display region; 12—circuit bonding region; 100—base carrier; 101—micro-groove; 200—flexible display panel; 201—flexible base.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
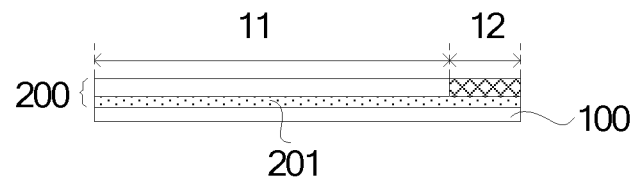
FIG. 1 is an illustrative view of forming a flexible display panel on a base carrier in conventional arts.
Figure 2:
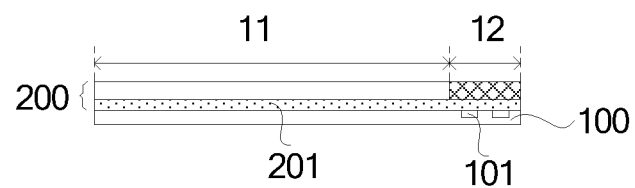
FIG. 2 is an illustrative view of forming a flexible display panel on a base carrier according to one embodiment of the present disclosure.
Figure 3:
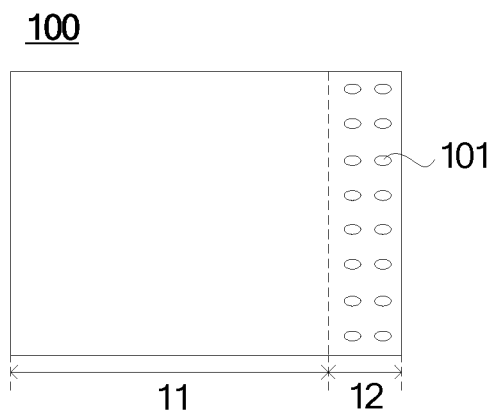
FIG. 3 is an illustrative view of the base carrier according to one embodiment of the present disclosure.

As illustrated in FIG. 2 and FIG. 3, one embodiment of the present disclosure provides a base carrier 100 configured to carry a flexible base 201 of a flexible display panel 200. The flexible display panel 200 comprises a display region 11 and a circuit bonding region 12. A surface of an area of the base carrier 100 corresponding to the display region 11 is a smooth surface, while a surface of an area corresponding to the circuit bonding region 12 is formed with a plurality of micro-grooves 101.

It is to be noted that the surface of the area of the base carrier corresponding to the display region is a smooth surface, which smooth surface is defined with respect to the surface of the area corresponding to the circuit bonding region and is not an absolutely smooth surface. The micro-grooves are formed in the surface of the area of the base carrier corresponding to the circuit bonding region. The micro-groove has an enclosed inner wall. When the flexible base is formed on the base carrier, the base carrier will cover the opening of the micro-groove and a closed space is formed between the micro-groove and the flexible base. When the flexible base and the base carrier are separated by irradiating the flexible base by laser, gas in the micro-grooves is expanded due to the laser heat effect. Thus, a relatively large volume of gas will be generated at the interface between the base carrier and the flexible base which is corresponding to the circuit bonding region, so that the interfacial adhesion of the flexible base and the base carrier is decreased.

One embodiment of the present disclosure provides a base carrier, which carries a flexible base of a flexible display panel. When the flexible base is separated from the base carrier after completing the flexible display panel, since a plurality of micro-grooves are formed in the surface of the base carrier corresponding to the circuit bonding region, gas in the micro-grooves is expanded due to the laser heat effect. Thus, a relatively large volume of gas will be generated at the interface between the base carrier and the flexible base which is corresponding to the circuit bonding region, so that the interfacial adhesion of the flexible base and the base carrier is decreased. Therefore, when peeling off the flexible base, the amount of laser required to peel off the flexible base in the area corresponding to the circuit bonding region is similar to the amount of laser required to peel off the flexible base in the area corresponding to the display region. Thus, scanning by laser can be performed once, so that the area of the flexible base corresponding to the display region and the area of the flexible base corresponding to the circuit bonding region are both separated from the base carrier.

In addition, the larger the micro-grooves on the base carrier are, the greater the volume of the expanded gas will be. Thus, to make the amount of laser required to peel off the circuit bonding region similar to that required to peel off the display region, an inner diameter of the micro-groove is no greater than 500 microns, for example, so that the amount of gas in each micro-groove is substantially uniform. For example again, the inner diameter of the micro-groove is no less than 20 microns.

Taking the micro-grooves 101 as illustrated in FIG. 2 as an example, since the micro-grooves are formed in the surface of the area of the base carrier corresponding to the circuit bonding region, the difference between the thickness of the base carrier and the depth of the micro-grooves is equal to the bottom thickness at the positions where the micro-grooves are disposed. The bottom thickness cannot be too small so as to avoid breakdown when being irradiated by laser. In one embodiment of the present disclosure, the depth of the micro-grooves is no greater than one tenth of the thickness of the base carrier.

Optionally, the micro-grooves are circular or rectangular. Of course, the micro-grooves can be triangular or of other irregular shapes. In the embodiments of the present disclosure, the shape of the micro-grooves is not restricted and a description is made by taking what is illustrated in the drawings as an example.

Figure 4:
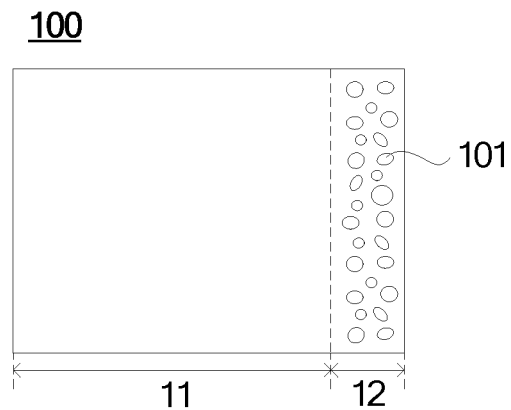
FIG. 4 is an illustrative view of the base carrier according to another embodiment of the present disclosure.

Optionally, as illustrated in FIG. 4, the surface of the area of the base carrier 100 corresponding to the circuit bonding region 12 is formed with micro-grooves 101 having various shapes. The micro-grooves as illustrated in FIG. 4 comprise circular grooves, oval grooves and the like.

For example, the micro-grooves are uniformly distributed in the area of the base carrier corresponding to a region which forms the circuit bonding region of the flexible display panel. Since the micro-grooves are uniformly distributed in the area of the base carrier corresponding to the circuit bonding region, the required amount of laser corresponding to peeling the circuit bonding region is uniform. Thus, a phenomenon in which a small amount of laser is required for peeling off a part of the region while a large amount of laser is required for peeling off other part of the region can be eliminated and a problem of incomplete peeling can be solved.

It is further optional that at least two of the plurality of micro-grooves are communicated with each other. Since the micro-grooves are communicated with each other, gas in the micro-grooves can be circulated and thus a problem that the amount of laser required for peeling is not uniform due to a large amount of expanded gas in larger grooves and a small amount of expanded gas in smaller grooves can be solved.

At least one embodiment of the present disclosure provides a manufacturing method of a base carrier configured to carry a flexible base of a flexible display panel, which display panel comprises a display region and a circuit bonding region. The method comprises forming a plurality of micro-grooves in the surface of an area of the base carrier corresponding to the circuit bonding region, by laser ablation or wet etching.

For example, forming a plurality of micro-grooves in the surface of an area of the base carrier corresponding to the circuit bonding region by laser ablation can be implemented by irradiating the base carrier by laser passing through a mask plate. The mask plate comprises a light transmissive region corresponding to the circuit bonding region. Laser can be irradiated onto the base carrier through the light transmissive region and thereby forming the micro-grooves on the base carrier.

The larger the micro-grooves on the base carrier are, the greater the volume of the expanded gas will be. To make the amount of laser required to peel off the circuit bonding region similar to that required to peel off the display region, in one embodiment of the present disclosure, an inner diameter of the micro-groove is no greater than 500 microns, so that the amount of gas in each micro-groove is substantially uniform. In another embodiment of the present disclosure, an inner diameter of the micro-groove is no less than 20 microns. In yet another embodiment of the present disclosure, the size of the thus-formed micro-groove can be controlled by adjusting the laser energy.

Figure 5:
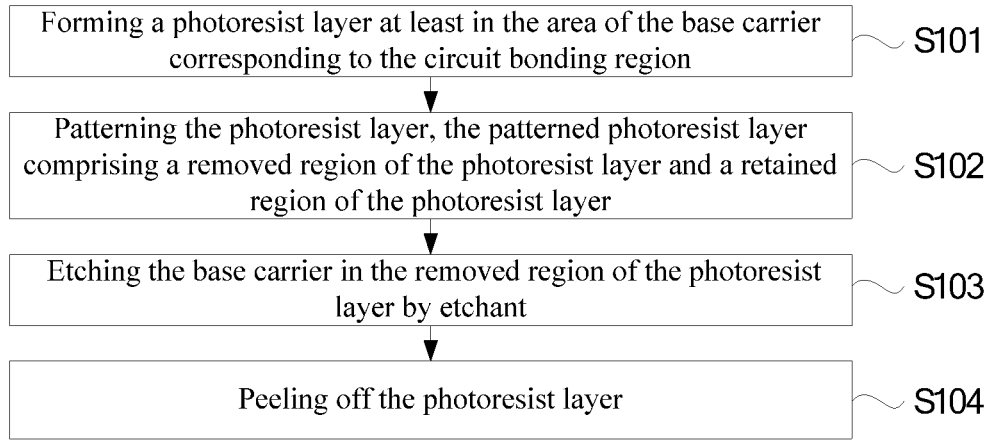
FIG. 5 is an illustrative view of a manufacturing method of the base carrier according to one embodiment of the present disclosure.

Optionally, as illustrated in FIG. 5, forming a plurality of micro-grooves in the surface of an area of the base carrier corresponding to the circuit bonding region by wet etching comprises:

Step 101 of forming a photoresist layer at least in the area of the base carrier corresponding to the circuit bonding region.

Since the micro-grooves are formed in the area of the base carrier corresponding to the circuit bonding region, the photoresist layer can be formed only in the area of the base carrier corresponding to the circuit bonding region and the micro-grooves are formed by use of the photoresist layer. Or alternatively, the photoresist layer can be formed on the entire base carrier (including the display region and the circuit bonding region) and the micro-grooves are formed by use of the photoresist layer.

It further comprises a step 102 of patterning the photoresist layer. The patterned photoresist layer comprises a removed region of the photoresist layer and a retained region of the photoresist layer.

The removed region of the photoresist layer is a region in which the base carrier is exposed. The retained region of the photoresist layer is a region in which the base carrier is covered by the photoresist layer.

It further comprises a step 103 of etching the base carrier in the removed region of the photoresist layer by etchant.

In the removed region of the photoresist layer, the base carrier is exposed and the etchant comes into contact with the base carrier and etches the base carrier, thereby forming the micro-grooves on the base carrier.

It further comprises a step 104 of peeling off the photoresist layer in the retained region of the photoresist layer.

Figure 7:
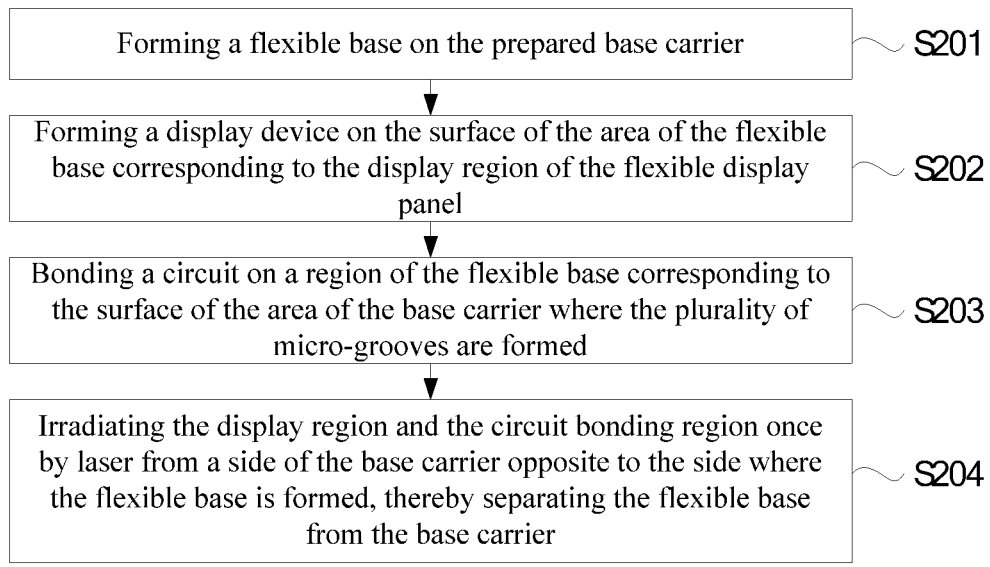
FIG. 7 is an illustrative view of the manufacturing method of the flexible display panel according to one embodiment of the present disclosure.

At least one embodiment of the present disclosure provides a manufacturing method of a flexible display panel. As illustrated in FIG. 7, the manufacturing method comprises:

a step 201 of forming a flexible base on the above-described base carrier according to the present disclosure.

For example, the base carrier can be a glass base carrier. The micro-grooves can be formed in the surface of the glass substrate by wet etching or laser ablation.

It further comprises a step 202 of forming a display device on the surface of the area of the flexible base corresponding to the display region of the flexible display panel. For example, a TFT array and a display device or the like are formed on the surface of the area of the flexible base corresponding to the display region of the flexible display panel. The display device can comprise an organic light emitting device, including for example a cathode, an anode, a light emitting functional layer, an electron transport functional layer, an electron injection functional layer, a hole transport functional layer, a hole injection functional layer and etc. The display device can also be an electronic paper device and the like. The display device is not restricted by the present disclosure which is illustrated by taking the above-described as an example only.

It further comprises a step 203 of bonding a circuit on a region of the flexible base corresponding to the surface of the area of the base carrier where the plurality of micro-grooves are formed. For example, the flexible circuit board can be connected with the connecting wire on the flexible base by pressing, so that the flexible circuit board can control the display device in the display region to display.

It further comprises a step 204 of irradiating the display region and the circuit bonding region once by laser from a side of the base carrier opposite to the side where the flexible base is formed, thereby separating the flexible base from the base carrier.

Figure 6:
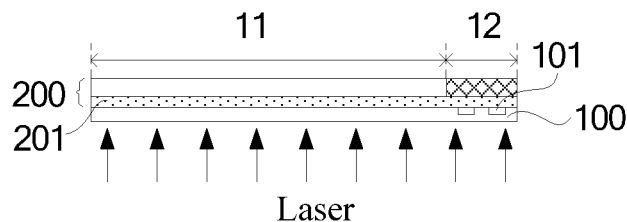
FIG. 6 is an illustrative view of separating the flexible display panel from the base carrier by laser according to one embodiment of the present disclosure.

As illustrated in FIG. 6, the base carrier 100 corresponding to the display region 11 and the circuit bonding region 12 of the flexible display panel 200 is irradiated once by the same laser. Since the micro-grooves 101 are formed in the surface of the area of the base carrier 100 corresponding to the circuit bonding region 12, the gas in the micro-grooves 101 will expanded in volume due to laser heat effect. Thus, a relatively large volume of gas will be generated at the interface between the base carrier 100 and the flexible base 201 which is corresponding to the circuit bonding region 12, so that the interfacial adhesion between the flexible base 201 of the flexible display panel 200 and the base carrier 100 is decreased. Therefore, when peeling off the flexible base, the amount of laser required to peel off the circuit bonding region is similar to the amount of laser required to peel off the display region. Thus, scanning by laser can be performed once, so that the display region of the flexible base and the circuit bonding region of the flexible base are both separated from the base carrier.

At least one embodiment of the present disclosure further provides a flexible display panel which is formed by the manufacturing method of a flexible display panel according to the above-described embodiment.

At least one embodiment of the present disclosure further provides a flexible display device comprising the flexible display panel according to the above-described embodiment. Here, the flexible display device comprises, but is not limited to, a display device such as a cell phone, a television, a personal assistant, and the like.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510189087.6 filed on Apr. 20, 2015, the disclosure of which is hereby entirely incorporated by reference as a part of the present disclosure.

The invention claimed is:

1. A base carrier configured to carry a flexible base of a flexible display panel, the flexible display panel comprising a display region and a circuit bonding region, wherein a surface of an area of the base carrier corresponding to the display region is smooth, and a surface of an area of the base carrier corresponding to the circuit bonding region is formed with a plurality of micro-grooves.

2. The base carrier according to claim 1, wherein inner diameters of the micro-grooves are no greater than 500 microns.

3. The base carrier according to claim 1, wherein inner diameters of the micro-grooves are no less than 20 microns.

4. The base carrier according to claim 1, wherein the micro-grooves have a depth no greater than one tenth of a thickness of the base carrier.

5. The base carrier according to claim 1, wherein the micro-grooves are circular or rectangular.

6. The base carrier according to claim 1, wherein at least two of the plurality of micro-grooves are communicated with each other.

7. The base carrier according to claim 1, wherein the micro-grooves are uniformly distributed in the area of the base carrier corresponding to the circuit bonding region.

8. A manufacturing method of a base carrier configured to carry a flexible base of a flexible display panel, the flexible display panel comprising a display region wherein a surface of an area of the base carrier corresponding to the display region is smooth, and a circuit bonding region, wherein the manufacturing method comprises:

forming a plurality of micro-grooves in the surface of an area of the base carrier corresponding to the circuit bonding region, by laser ablation or wet etching.

9. The manufacturing method according to claim 8, wherein forming a plurality of micro-grooves in the surface of an area of the base carrier corresponding to the circuit bonding region by wet etching comprises:

forming a resist layer at least on the area of the base carrier corresponding to the circuit bonding region;

patterning the resist layer so as to form a removed region of the resist layer and a retained region of the resist layer;

etching the base carrier in the removed region of the resist layer by etchant;

peeling off the resist layer.

10. A manufacturing method of a flexible display panel, comprising:

forming a flexible base on the base carrier according to claim 1;

forming a display device on the surface of the area of the flexible base corresponding to the display region of the flexible display panel;

bonding a circuit on a region of the flexible base corresponding to the surface o l the base carrier where the plurality of micro-grooves are formed; and irradiating the display region and the circuit bonding region once by laser from a side of the base carrier opposite to the side where the flexible base is formed, so as to separate the flexible base from the base carrier.

11. A flexible display panel, manufactured by the manufacturing method according to claim 10.

12. A flexible display device, comprising the flexible display panel according to claim 11.

13. The base carrier according to claim 2, wherein inner diameters of the micro-grooves are no less than 20 microns.

14. The base carrier according to claim 2, wherein the micro-grooves have a depth no greater than one tenth of a thickness of the base carrier.

15. The base carrier according to claim 3, herein the micro-grooves have a depth no greater than one tenth of a thickness of the base carrier.

16. The base carrier according to claim 2, wherein the micro-grooves are circular or rectangular.

17. The base carrier according to claim 3, wherein the micro-grooves are circular or rectangular.

18. The base carrier according to claim 4, wherein the micro-grooves are circular or rectangular.

19. The base carrier according to claim 2, wherein at least two of the plurality of micro-grooves are communicated with each other.

20. The base carrier according to claim 3, wherein at least two of the plurality of micro-grooves are communicated with each other.

* * * * *